(12) United States Patent
Lee et al.

(10) Patent No.: US 8,378,712 B2
(45) Date of Patent: Feb. 19, 2013

(54) INTEGRATED CIRCUIT WITH CROSSLINKED INTERCONNECT NETWORKS

(75) Inventors: Fung Fung Lee, Beijing (CN); Wen Zhou, Beijing (CN)

(73) Assignee: Agate Logic, Inc., Sunnyvale, CA (US)

( * ) Notice: Subject to any disclaimer, the term of this patent is extended or adjusted under 35 U.S.C. 154(b) by 62 days.

(21) Appl. No.: 12/437,919

(22) Filed: May 8, 2009

(65) Prior Publication Data

US 2009/0289661 A1 Nov. 26, 2009

(51) Int. Cl.
*H01L 25/00* (2006.01)
(52) U.S. Cl. ............................. 326/41; 326/38; 326/47
(58) Field of Classification Search .............. 326/37–41, 326/47
See application file for complete search history.

(56) References Cited

U.S. PATENT DOCUMENTS

| | | | | |
|---|---|---|---|---|
| 5,530,814 | A * | 6/1996 | Wong et al. | 710/317 |
| 6,456,752 | B1 * | 9/2002 | Dragone | 385/17 |
| 6,625,793 | B2 * | 9/2003 | Sample et al. | 326/38 |
| 6,940,308 | B2 * | 9/2005 | Wong | 326/41 |
| 7,224,184 | B1 * | 5/2007 | Levi et al. | 326/41 |
| 7,498,840 | B2 * | 3/2009 | LePape | 326/41 |
| 7,622,779 | B2 * | 11/2009 | Cheng et al. | 257/401 |
| 2005/0063373 | A1 * | 3/2005 | DeHon et al. | 370/380 |

* cited by examiner

*Primary Examiner* — Shawki Ismail
*Assistant Examiner* — Christopher Lo
(74) *Attorney, Agent, or Firm* — JW Law Group, PC; James M. Wu

(57) ABSTRACT

The present invention provides in a first aspect a programmable interconnect network for an array of logic blocks, which comprises a plurality of switch boxes being connected in a tree-based hierarchical architecture and providing selection and connection for the logic blocks, switch boxes located at the lowest level of the tree structure are connected to the logic blocks; wherein said network comprises a crosslink established between two of said plurality of switch boxes. The present invention helps implement functions with more area and timing efficiency and/or placement-friendliness.

29 Claims, 19 Drawing Sheets

INTEGRATED CIRCUIT WITH CROSSLINKED INTERCONNECT NETWORKS

RIGHT OF PRIORITY OF FOREIGN APPLICATION

This application claims the priority of an earlier filed Chinese patent application Ser. No. 200810112415.2, filed on May 23, 2008, with State Intellectual Property Office of the People's Republic of China, hereby incorporated by reference.

TECHNICAL FIELD

This invention relates to an integrated circuit, and more particularly, to an integrated circuit comprising a programmable logic array and a programmable interconnect network.

BACKGROUND OF THE INVENTION

There are many applications which require integrated circuit with configurable interconnect networks. One such application is a FPGA (Field Programmable Gate Array) where logic gates are to be connected to each other by programmable interconnect networks. Functioning either as a stand-alone chip or as a core part in a system, FPGA has been widely used in numerous microelectronic devices. The FPGA logic gate is generally defined to be not only a simple NAND gate, but also a logic cell having combinational logic and timing logic comprising configurable function, or a logic block formed by interconnecting a plurality of the logic cells.

A prior art interconnect network for field programmable (FP) logic cell array is of tree-based hierarchical architecture, in which logic cells are in the lowest level of the tree, and are interconnected with each other through hierarchical switch box (referred to as HSB) located at other joints of the tree topology. The hierarchical interconnect architecture has brought forth high efficiency and scalability in interconnection network.

However, in the tree structure, physical distance and logic distance between two HSBs are two different concepts, and may sometimes be completely inconsistent. Here, 'logical' is a term redefined in the context of tree structure, and logical distance is defined in term of number of switch boxes traversed or number of edges traversed when going up and down the tree from one switch box to another one. For example, two HSBs are physically near with each other but need to traverse a number of HSBs to reach each other. Such a tree structure may lead to delay in timing, especially for those in physically neighborhood. Also, the tree-structured interconnect network may be sensitive to logic layout. A change in logic layout may lead to change of wirings between logics, which might unfavorably affect overall logic timing.

SUMMARY OF THE INVENTION

Therefore, it is an object of the present invention to provide an integrated circuit comprising a new interconnect network, which may be programmed to implement functions with more area and timing efficiency and/or placement-friendliness.

The present invention provides in a first aspect an integrated circuit, comprising a programmable interconnect network and an array of logic blocks connected by the programmable interconnect network, wherein said programmable interconnect network comprises a plurality of switch boxes being connected in a tree-based hierarchical architecture and providing selection and connection for the logic blocks, switch boxes located at the lowest level of the tree structure are connected to the logic blocks; wherein said network comprises a crosslink established between two of said plurality of switch boxes.

In a second aspect, the present invention provides an integrated circuit, which comprises a programmable interconnect network and an array of logic blocks connected by the programmable interconnect network, said integrated circuit further comprising a functional block, said programmable interconnect network comprising a plurality of switch boxes being connected in a tree-based hierarchical architecture and providing selection and connection for the logic blocks, switch boxes located at the lowest level of the tree structure are connected to the logic blocks; wherein said circuit comprises a crosslink between one of said plurality of switch boxes and the functional block.

Logic block as mentioned above may be a logic cell, or formed by a plurality of logic cells.

The above and other objects, features, and advantages of the present invention will become apparent from the following detailed description thereof, which is described with reference to the accompanying drawings in which the like reference numerals represent the same or similar elements. Since each logic block can only be connected to a HSB in lowest level of the tree in a manner of one-to-one, the logic blocks are omitted in the figures for the sake of emphasis on interconnect network.

BRIEF INTRODUCTION OF THE DRAWING

The exemplary embodiment(s) of the present invention will be understood more fully from the detailed description given below and from the accompanying drawings of various embodiments of the invention, which, however, should not be taken to limit the invention to the specific embodiments, but are for explanation and understanding only.

Figure 12:
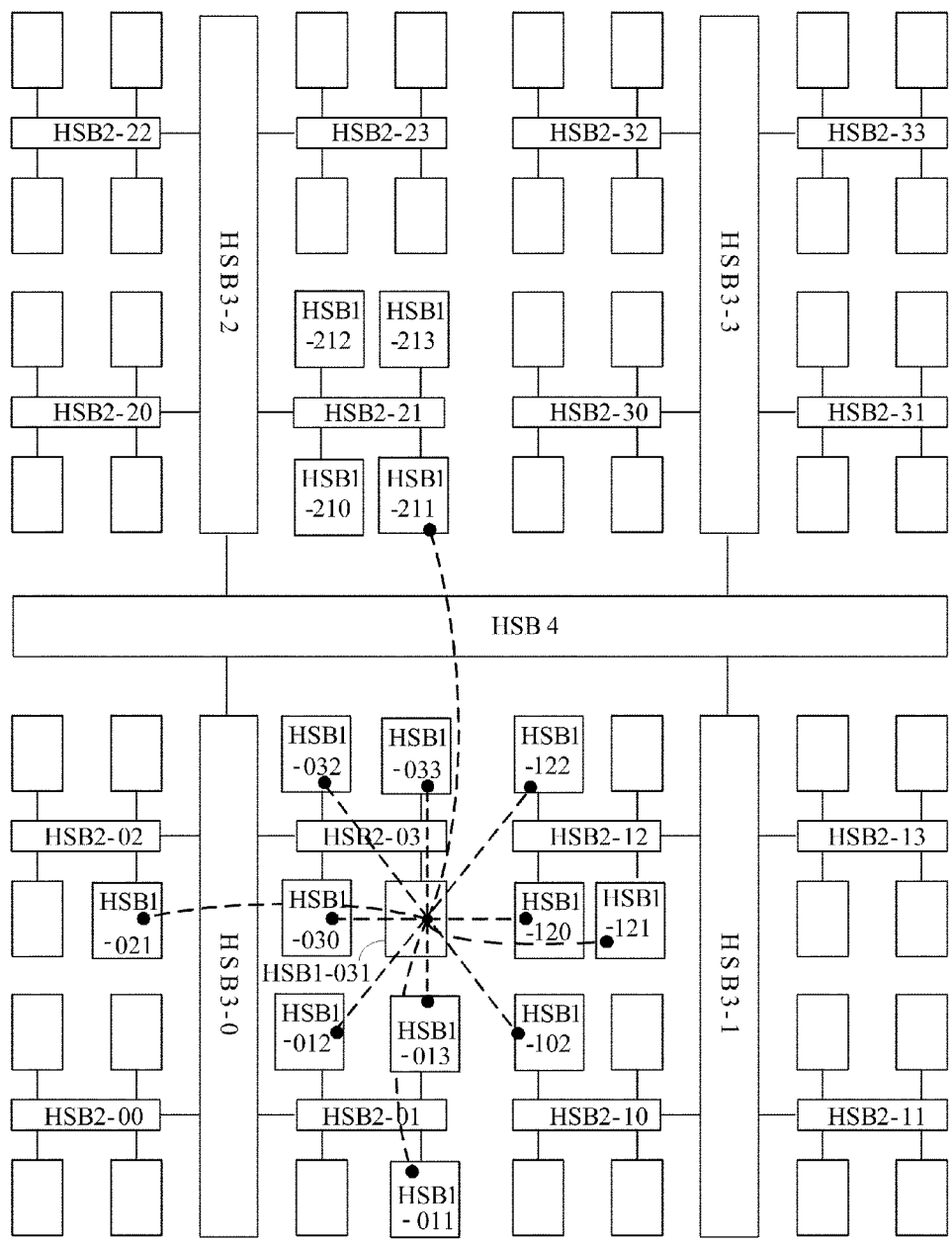
Figure 12:
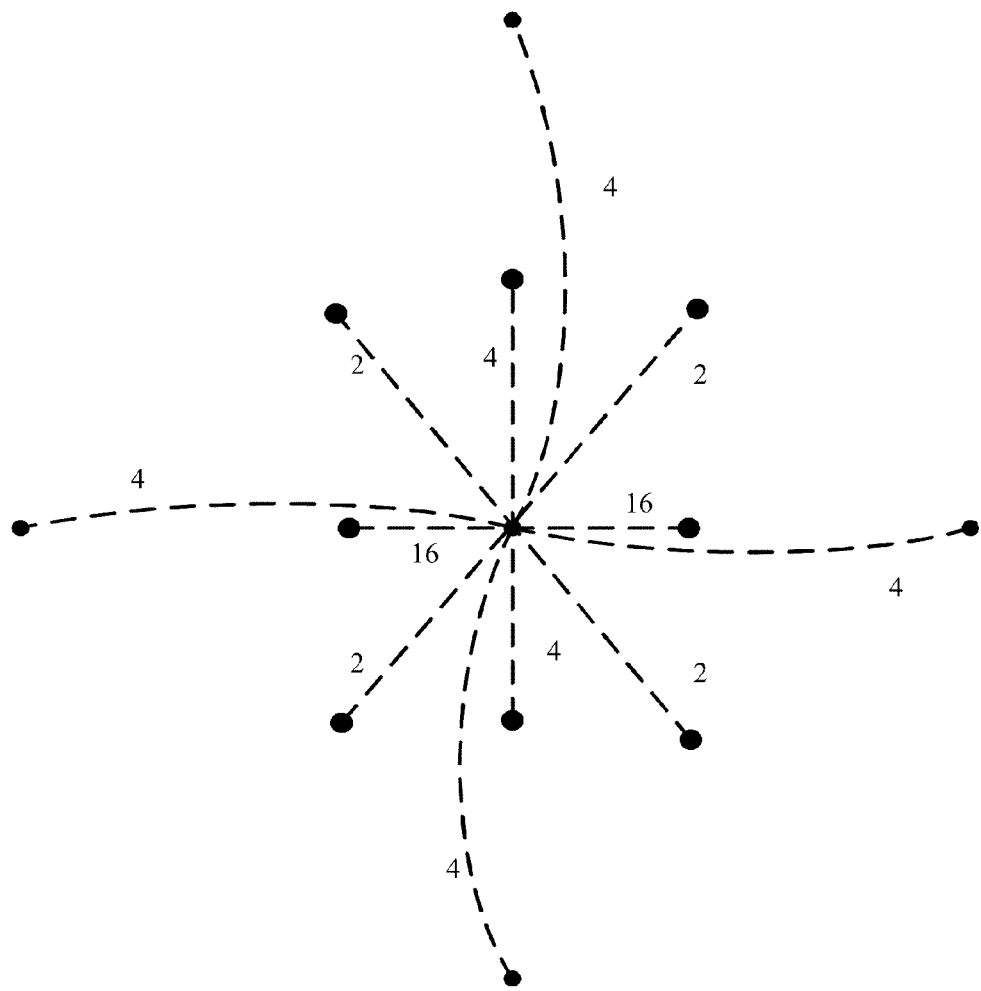
Figure 13:
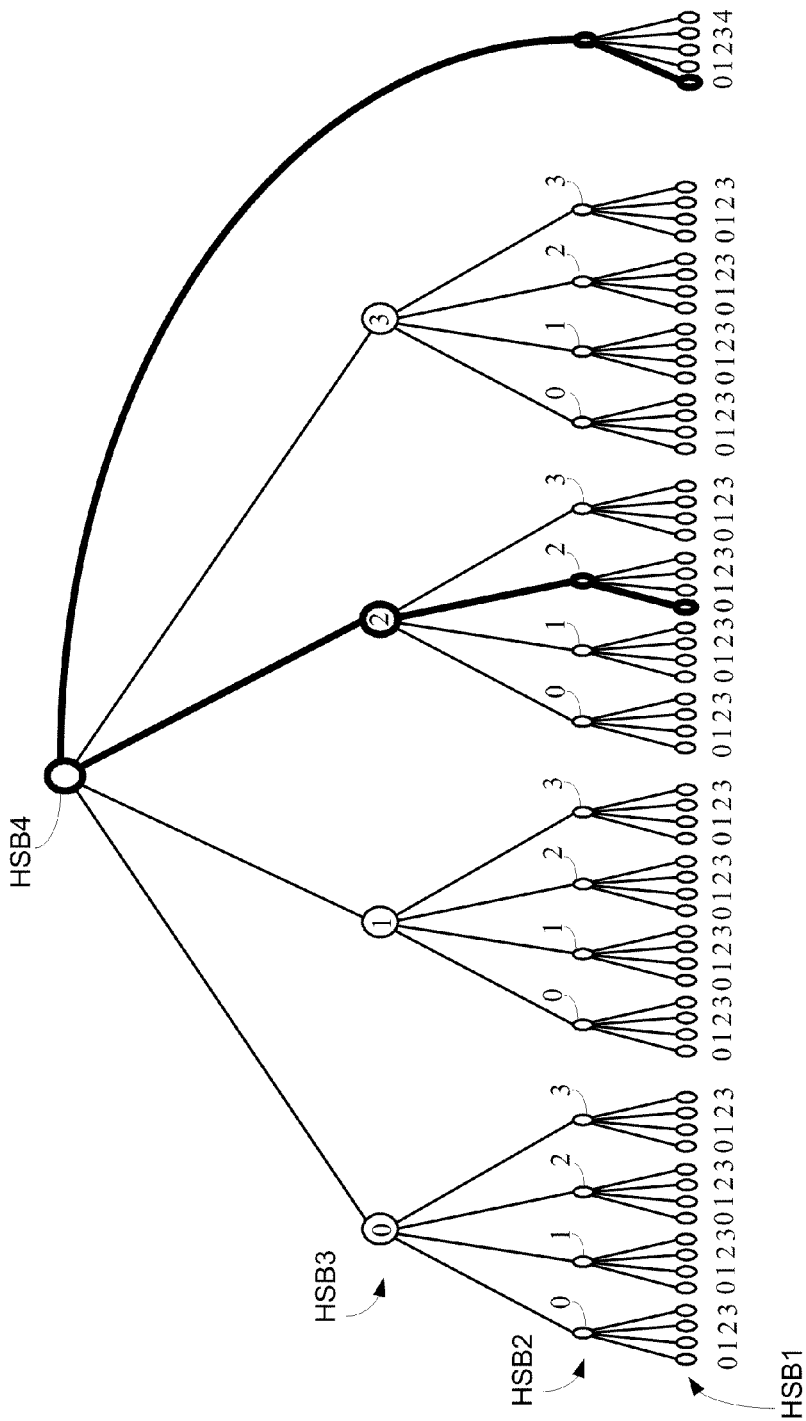
Figure 14:
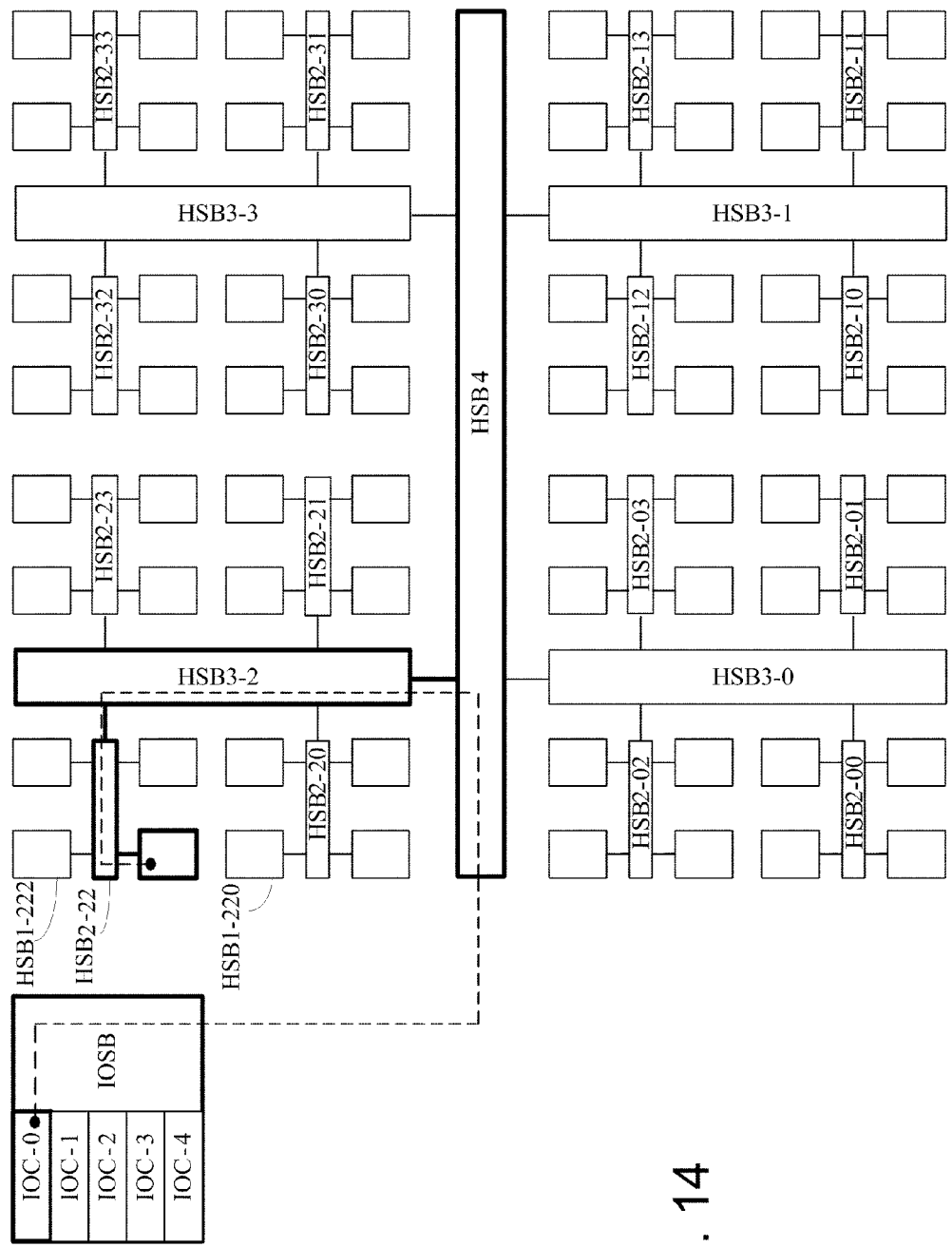
Figure 15:
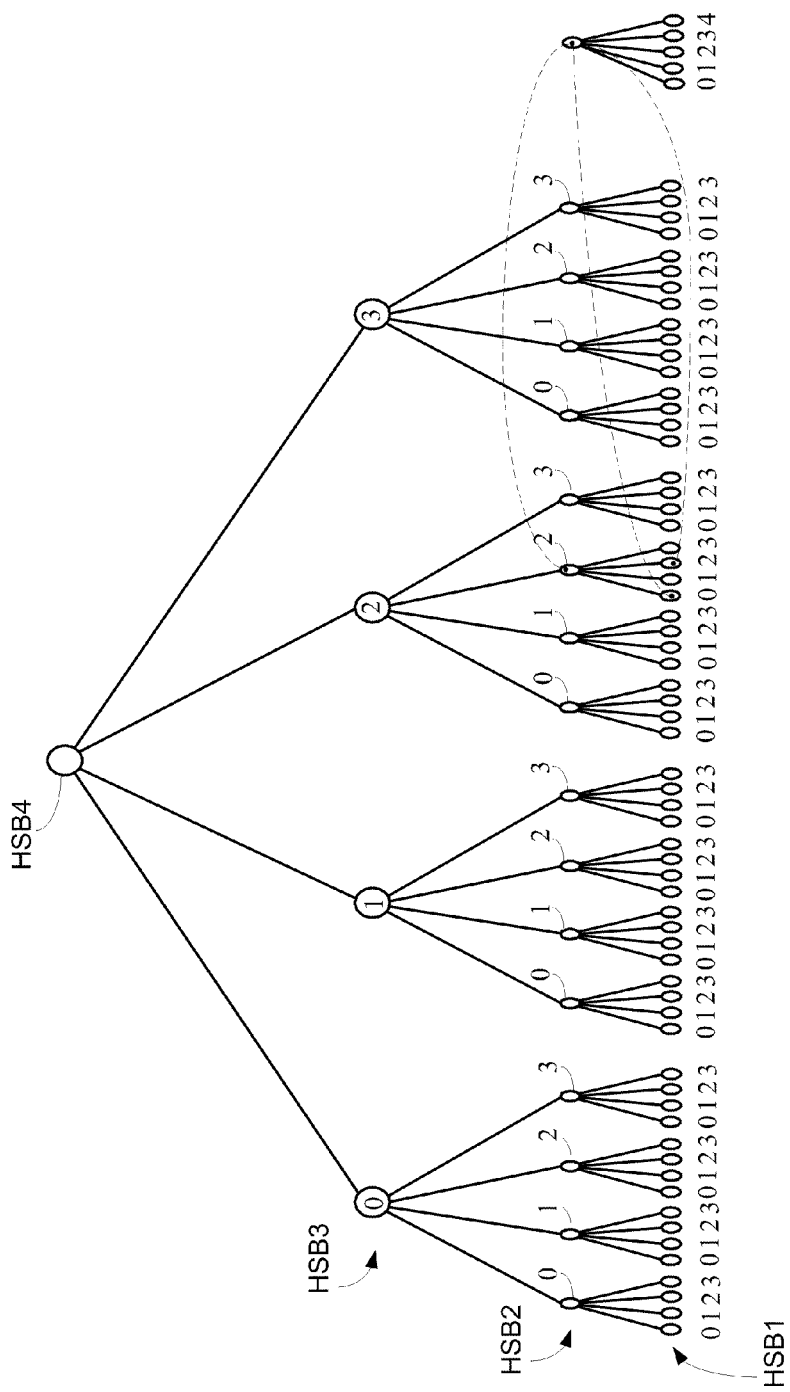
Figure 16:
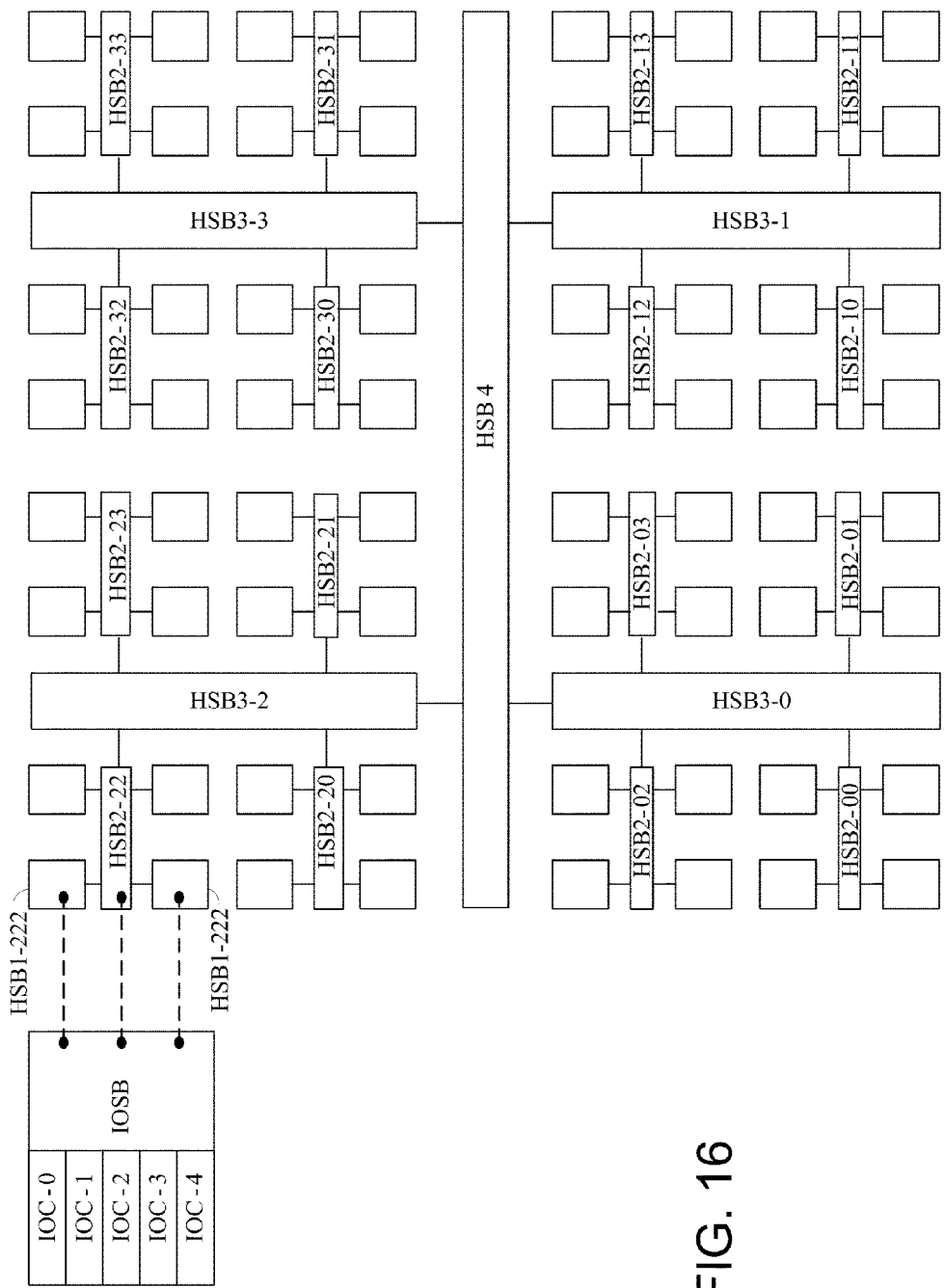

FIGS. 11(a) and (b) illustrate how a change in position of a layout may affect wirings between logics;

FIGS. 12(a) and (b) illustrate an enhanced stencil with crosslinks according to the present invention;

FIG. 13 is a logic graph illustrating an interconnect network between tree-based hierarchical interconnect network and an external functional block;

FIG. 14 is the layout diagram of the interconnect network of FIG. 13;

FIG. 15 is a logic graph illustrating an interconnect network comprising a crosslink established between a tree-based hierarchical interconnect network and an external functional blocks according to an embodiment of the present invention;

FIG. 16 is the layout diagram of the interconnect network of FIG. 15; and

Figure 17:
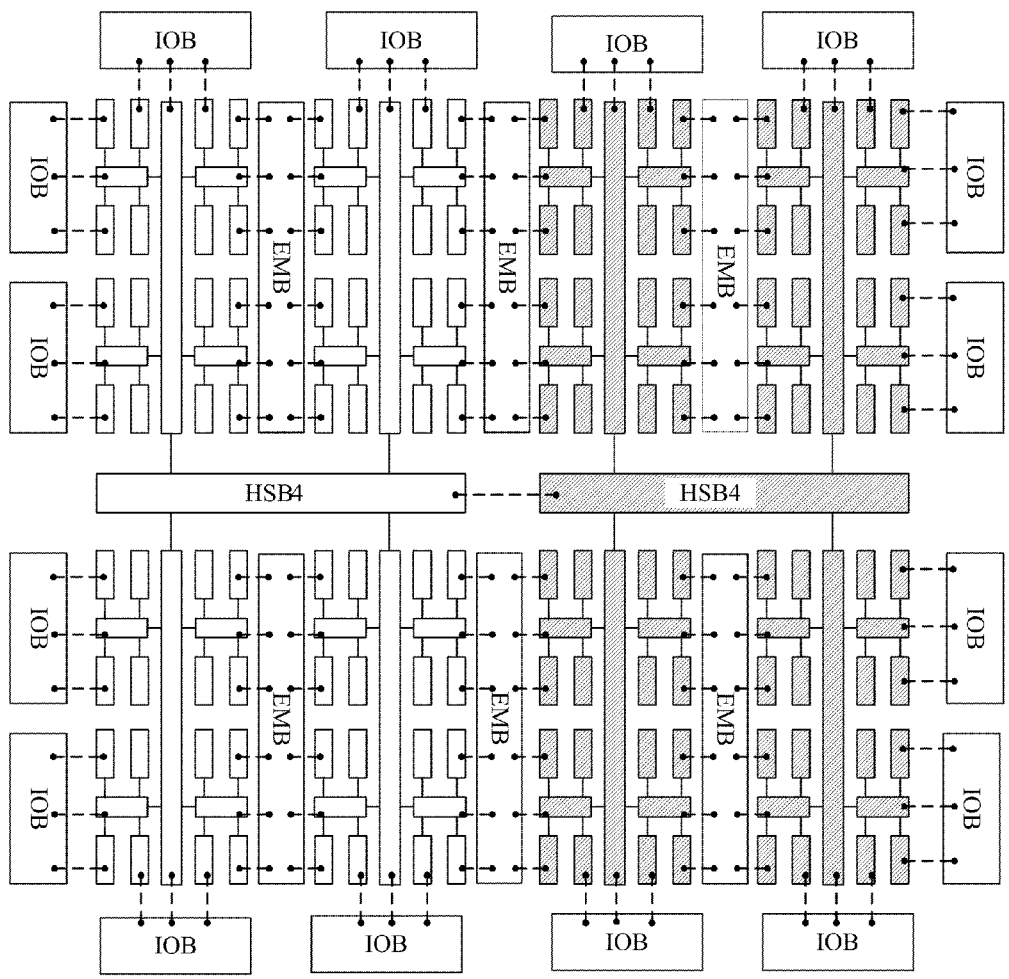

FIG. 17 illustrates a hybrid integrated circuit according to another embodiment of the present invention.

DETAILED DESCRIPTION OF THE PREFERRED EMBODIMENT

Figure 1:
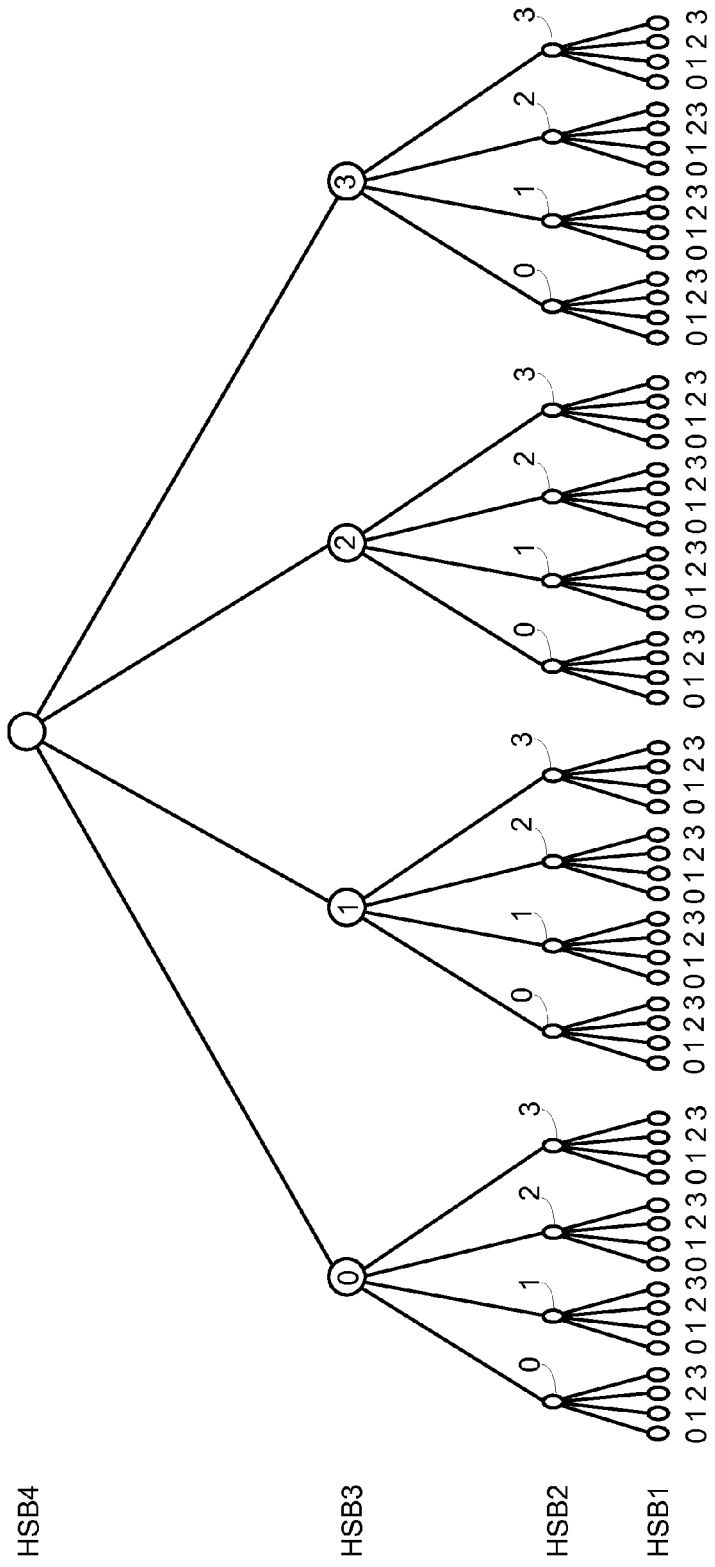
FIG. 1 illustrates a logic graph of a prior art tree based hierarchical architecture of interconnect network for FP logics.

FIG. 1 illustrates a logic graph of a tree based hierarchical architecture of interconnect network for FP logics. As shown in FIG. 1, there is a quad tree formed by 4 levels of hierarchical switch boxes (referred below as HSB), which has an upside-down structure with the root drawn at the top. The HSBs are configured to implement programmable routing paths to an array of FP logic cells, which are not shown in this figure. More specifically, every four neighboring HSBs in bottom level 1 (referred as HSB1), labeled respectively as 0, 1, 2, and 3, are connected to a HSB in level 2 (HSB2). Every four neighboring HSBs in level 2, respectively labeled with number of 0, 1, 2, and 3, are connected to a HSB in level 3 (HSB3). All the four HSBs in level 3, respectively labeled with number of 0, 1, 2, and 3, are connected to the HSB4. For better illustration, HSBs in lower level are referred to as children HSBs, and HSB being in direct connection with the children HSBs, is referred to as the parent HSB.

Figure 2:
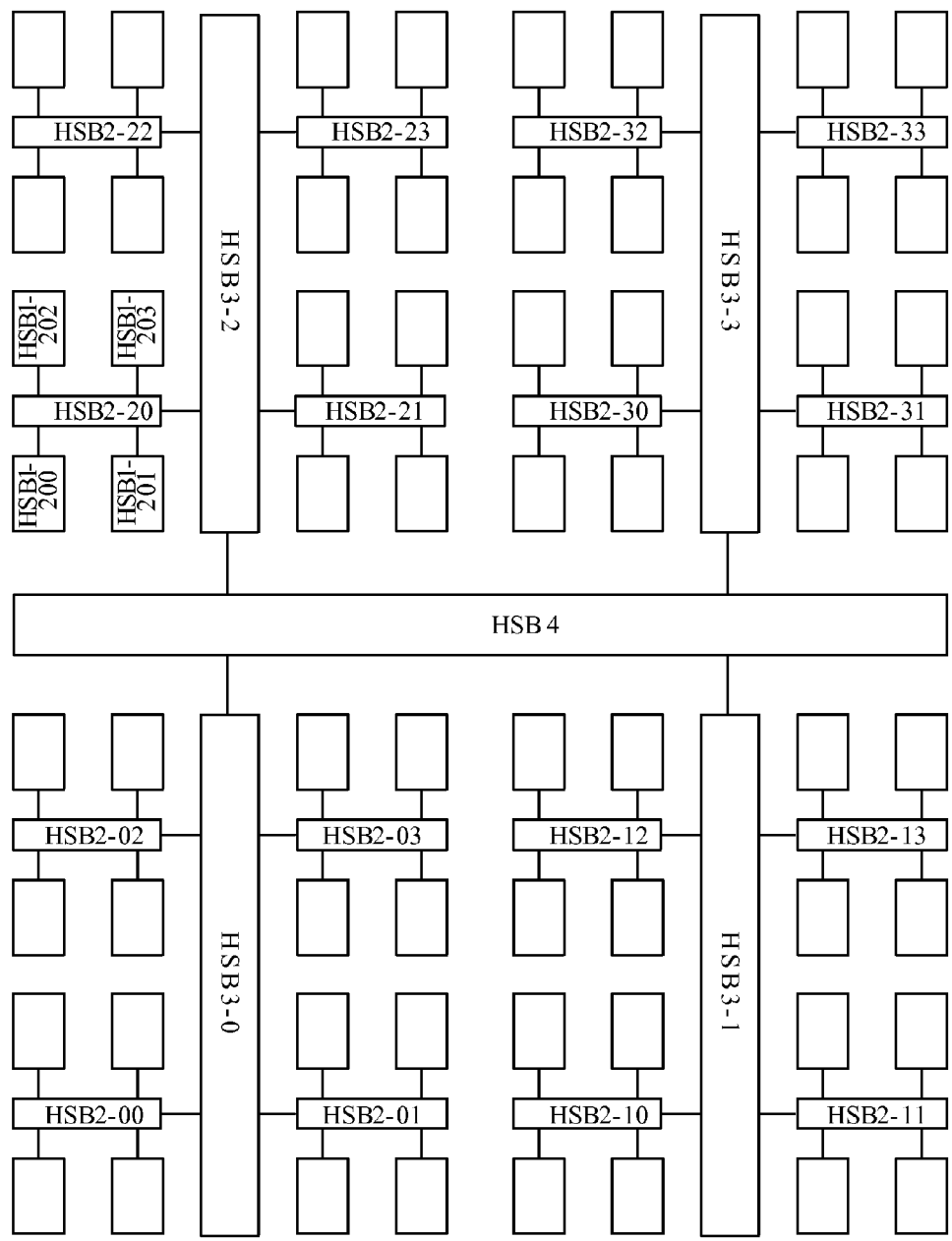
FIG. 2 illustrates a layout diagram of the tree-based interconnect network of FIG. 1.

FIG. 2 is the layout diagram of the tree-structured interconnect network of FIG. 1. Please note that the HSBs in the FIG. 2 are labeled with additional numbers so as to differentiate with each other. There is only one HSB in level 4, thus no further labeling for this HSB4. In level 3, a HSB is labeled as HSB3-N, where N is the HSB's label number as shown in FIG. 1. In level 2, a HSB is labeled as HSB2-MN, where M represents label number of parent HSB of this HSB as shown in FIG. 1, and N represents the HSB's label number as shown in FIG. 1. In level 1, a HSB is labeled as HSB1-PMN, wherein P represents the label number of the grand-parent HSB of this HSB as shown in FIG. 1, M represents label number of parent HSB of this HSB as shown in FIG. 1, and N represents the HSB's label number as shown in FIG. 1.

For example, the four HSBs in level 3 are labeled as HSB3-0, HSB3-1, HSB3-2, HSB3-3, respectively. The four HSBs in level 2, which are in direct connection with HSB3-2, are labeled as HSB2-20, HSB2-21, HSB2-22, HSB2-23, respectively. The four HSBs in level 1, which are in direct connection with HSB2-20, are labeled as HSB1-200, HSB1-201, HSB1-202, HSB1-203, respectively.

Note from the FIGS. 1 and 2 that some HSBs are logically far from but physically near with each other. As mentioned above, logical distance is equal to number of edges or number of nodes traversed or hopped when going up and down the tree from one switch box to another one. Logical distance may be measured in term of hop count. Going from one HSB to next HSB in the tree means one hop. Term 'logically far' is meant to be a distance with hop count of for example 4 or more.

The present invention provides a crosslink between the HSBs to shorten the logical distance between those HSBs logically far from but physically near. The crosslink is meant to be a non-tree-structured shortcut.

Figure 3:
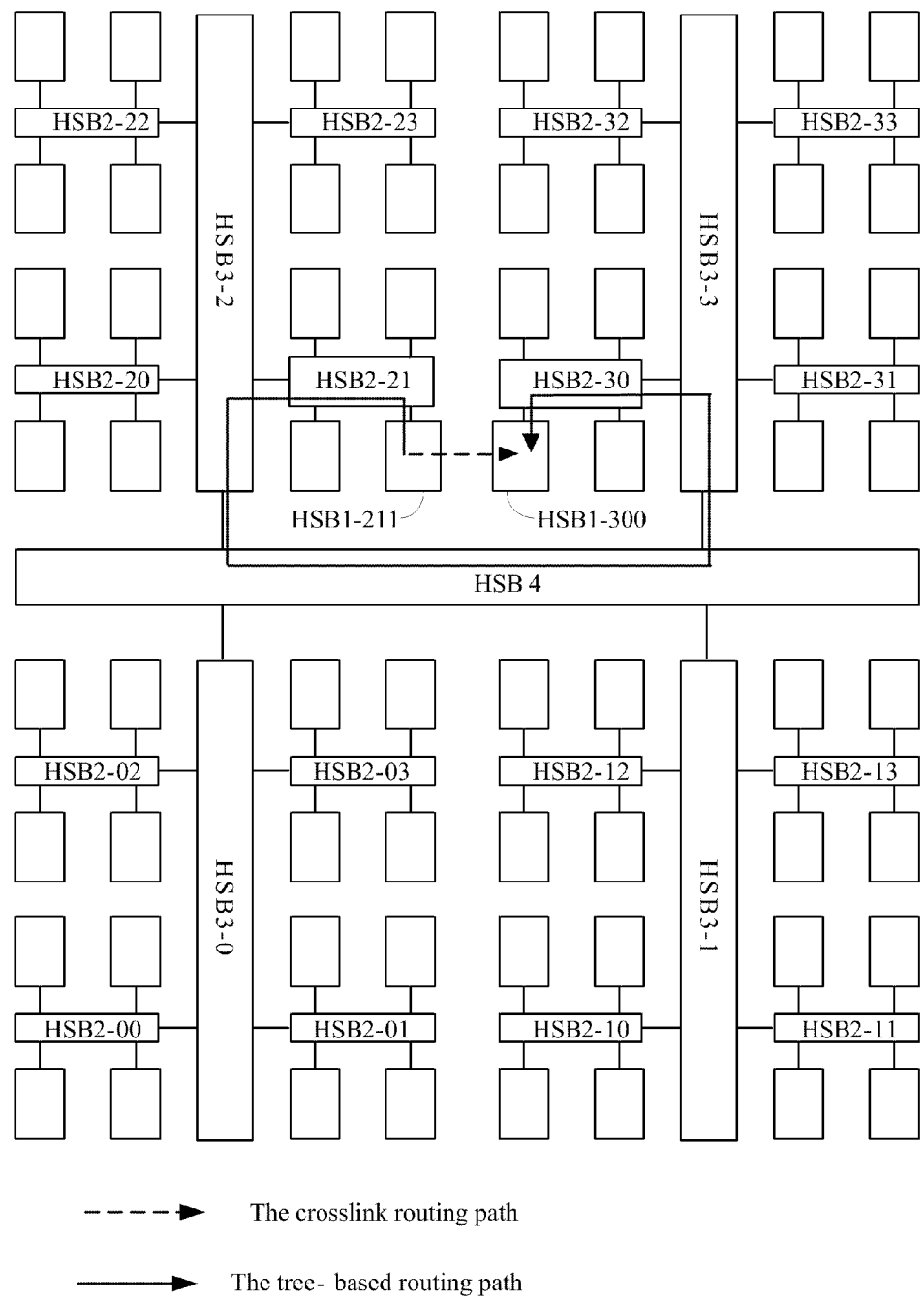
FIG. 3 illustrates a crosslink established in tree-based hierarchical interconnect architecture according to an embodiment of the present invention.

FIG. 3 illustrates such a crosslink established in the tree-based hierarchical architecture according to an embodiment of the present invention. As shown in FIG. 3, HSB1-211 is a HSB in level 1 with a label number of 1, and has a parent HSB in level 2 with label number of 1 and a grandparent HSB in level 3 with label number of 2. HSB1-300 is a HSB in level 1 with label number of 0, and has a parent HSB in level 2 with label number of 0 and a grandparent HSB in level 3 with label number of 3. As shown in FIG. 3, HSB1-211 and HSB1-300 are physically near.

A tree path for connecting HSB1-211 to HSB1-300 includes HSB2-21, HSB3-2, HSB4, HSB3-3, and HSB2-30. To make this interconnection, five more HSBs have to be involved and HSB1-211 needs to make 6 hops to reach HSB1-300, i.e., hop count=6. Hop count of 6 means that HSB1-211 and HSB1-300 are logically far.

According to the present invention, a crosslink, being shown in dashed line, may be made between HSB1-211 and HSB1-300. By means of this crosslink, no other HSB is involved in their connection, which means a hop count equal to 1, much less than the tree-structured interconnect.

By means of this crosslink, any HSB may be directly connected to another HSB in its physical neighborhood within this interconnect network. This may lead to a connection with fewer HSBs involved, thus achieving faster response.

Figure 4:
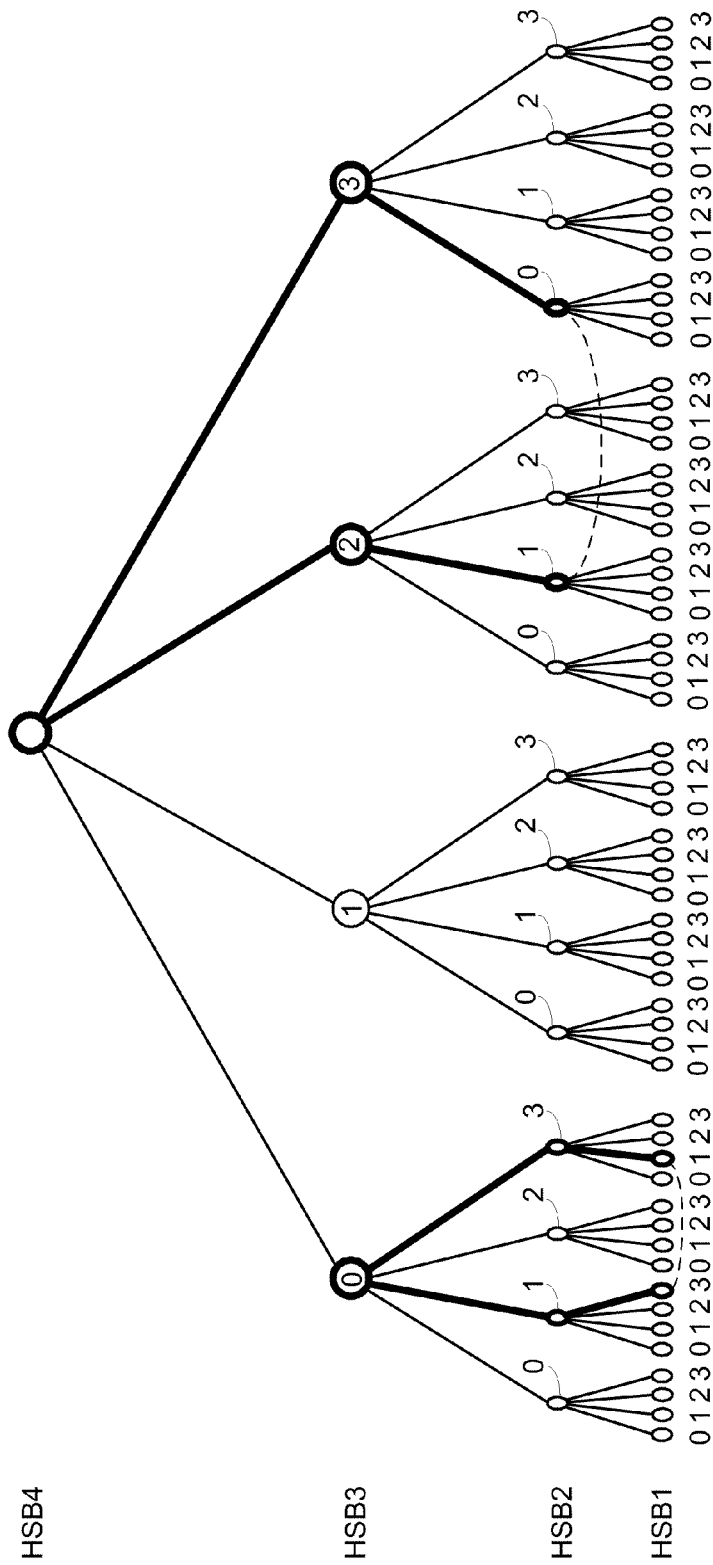
FIG. 4 is a logic graph illustrating crosslink made between two HSBs belonging to same level.

FIG. 4 is a logic graph illustrating crosslink made between two HSBs having same levels. As shown in FIG. 4, two HSBs in level 1 with hop count=4, HSB1-013 and HSB1-031, are crosslinked together. The crosslink is in dashed line. The HSB1-013 has an own label number of 3, parent label number of 1, and grandparent label number of 0. The HSB1-031 has an own label number of 1, parent label number of 3, and grandparent label number of 0.

Contradict to the crosslink, a traditional tree path involves three more HSBs, including HSB2-01, HSB3-0 and HSB2-03, which means more hops to make and longer time of response.

Note also in the same figure that another two HSBs in level 2, HSB2-21 and HSB2-30, are crosslinked so that a tree path with hop count of 4 is replaced with a new shortcut with hop count of 1, and no more HSBs than themselves will be involved in establishing the interconnection.

The tree paths are shown thickened.

Figure 5:
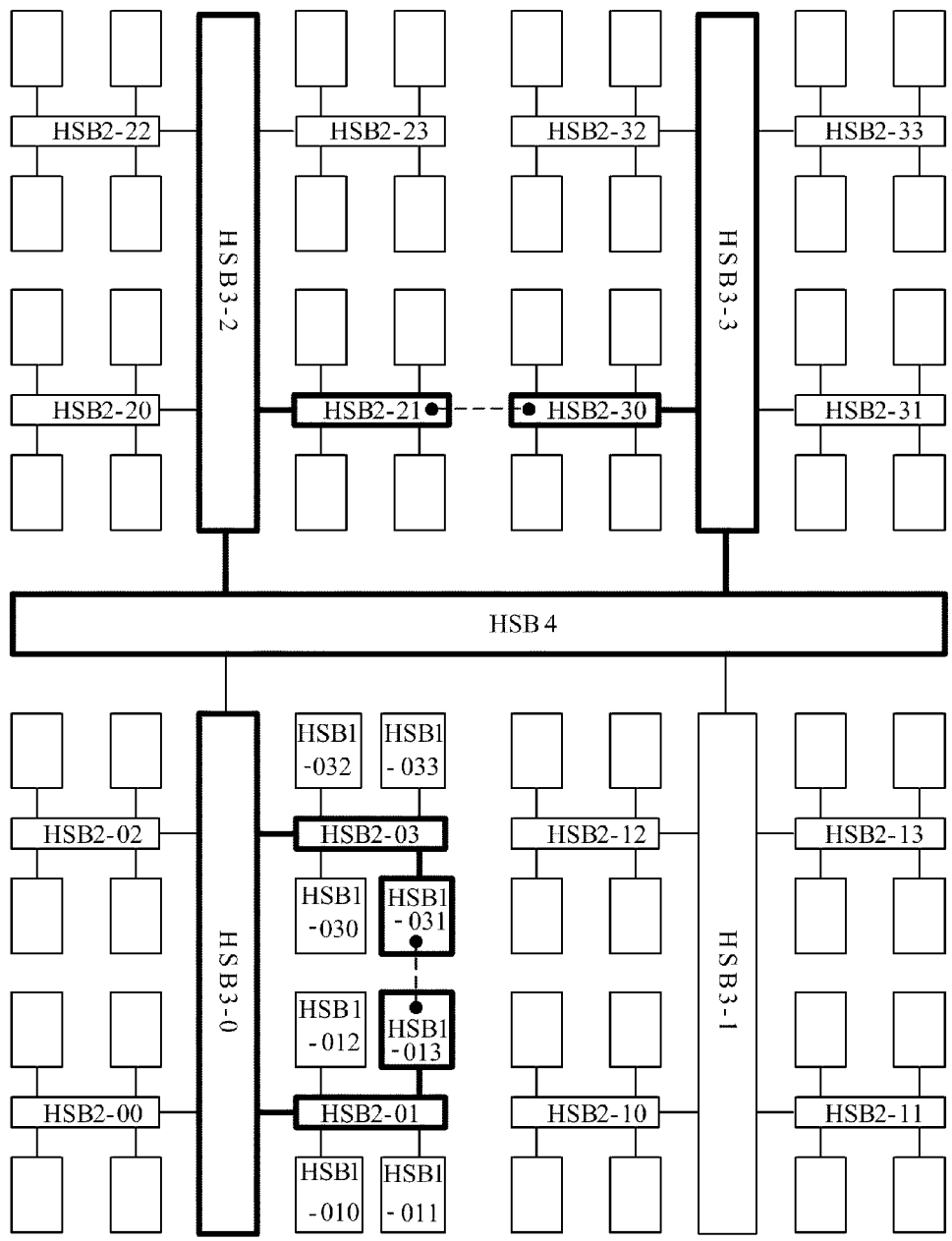
FIG. 5 is the layout diagram of the interconnect network of FIG. 4.

FIG. 5 is the layout diagram of the interconnect network of FIG. 4. From the FIG. 5, it can be noted that HSB1-031 and HSB1-013 are physically near, and HSB2-21 and HSB2-30 are physically near. Therefore, by crosslink, the two HSB physically near but logically far are interconnected directly with each other.

Please note that the tree paths and the HSBs in the paths are shown thickened.

It will be appreciated that, although HSB1-031 and HSB1-013 is shown to be physically near in FIG. 5, it is not necessarily so. It could possibly turn out that they are physically far and another two HSB, for example HSB1-032 and HSB1-010, are physically near. Which of HSBs are physically near will depend on the real layout and FIG. 5 is only illustrative. It is important that those HSBs physically near but logically far in the tree structure could be interconnected directly with each other by crosslink.

Figure 6:
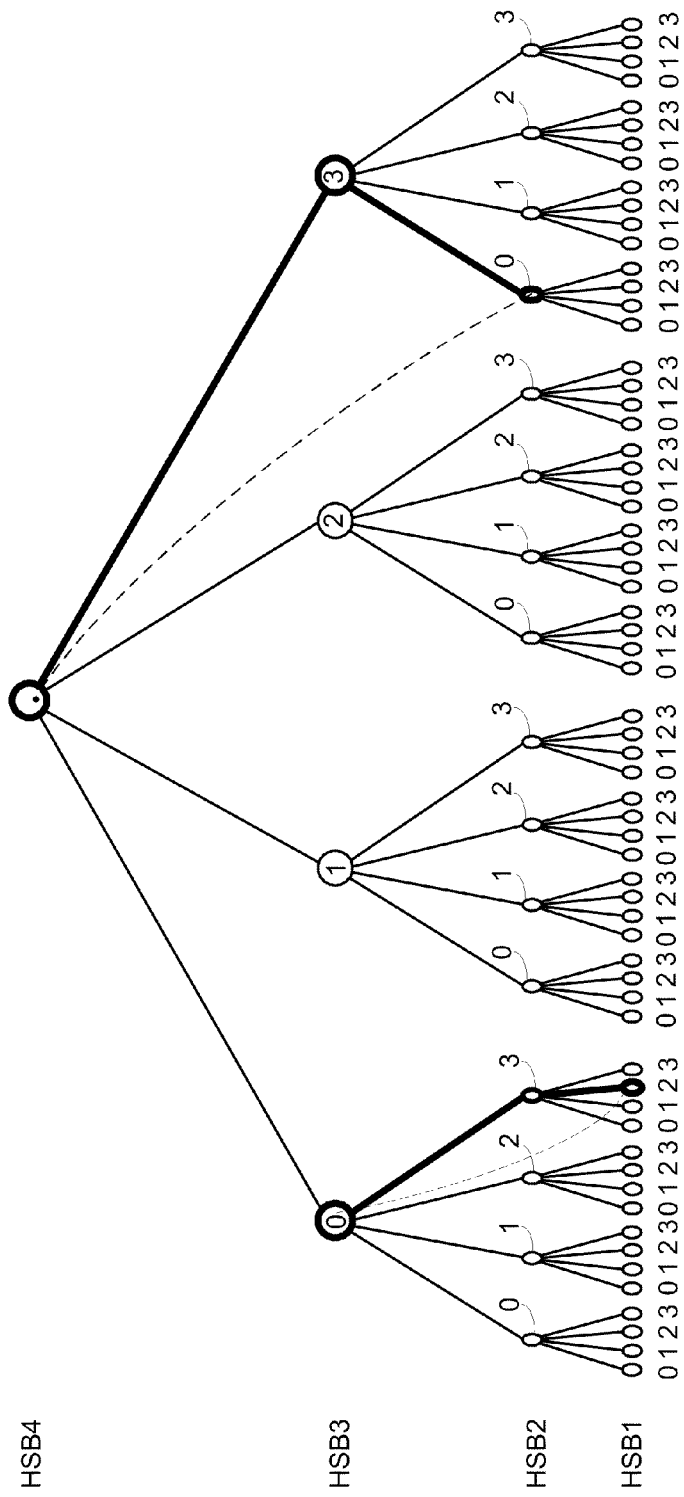
FIG. 6 is a logic graph illustrating a crosslink made between HSBs belonging to the same subtree but different levels.

FIG. 6 is a logic graph illustrating a crosslink made between HSBs belonging to the same subtree but different levels, wherein one of said two switch boxes is the root of the subtree or ancestor of the other. As shown in FIG. 6, a HSB3-0 is cross-linked with a HSB1-032. HSB2-32, a key and indispensable HSB in the tree-structured interconnect path, is not involved in the crosslink. In addition, another two HSBs, HSB4 and HSB2-30 are cross-linked, without HSB3-3 being involved. The tree paths are shown thickened.

Figure 7:
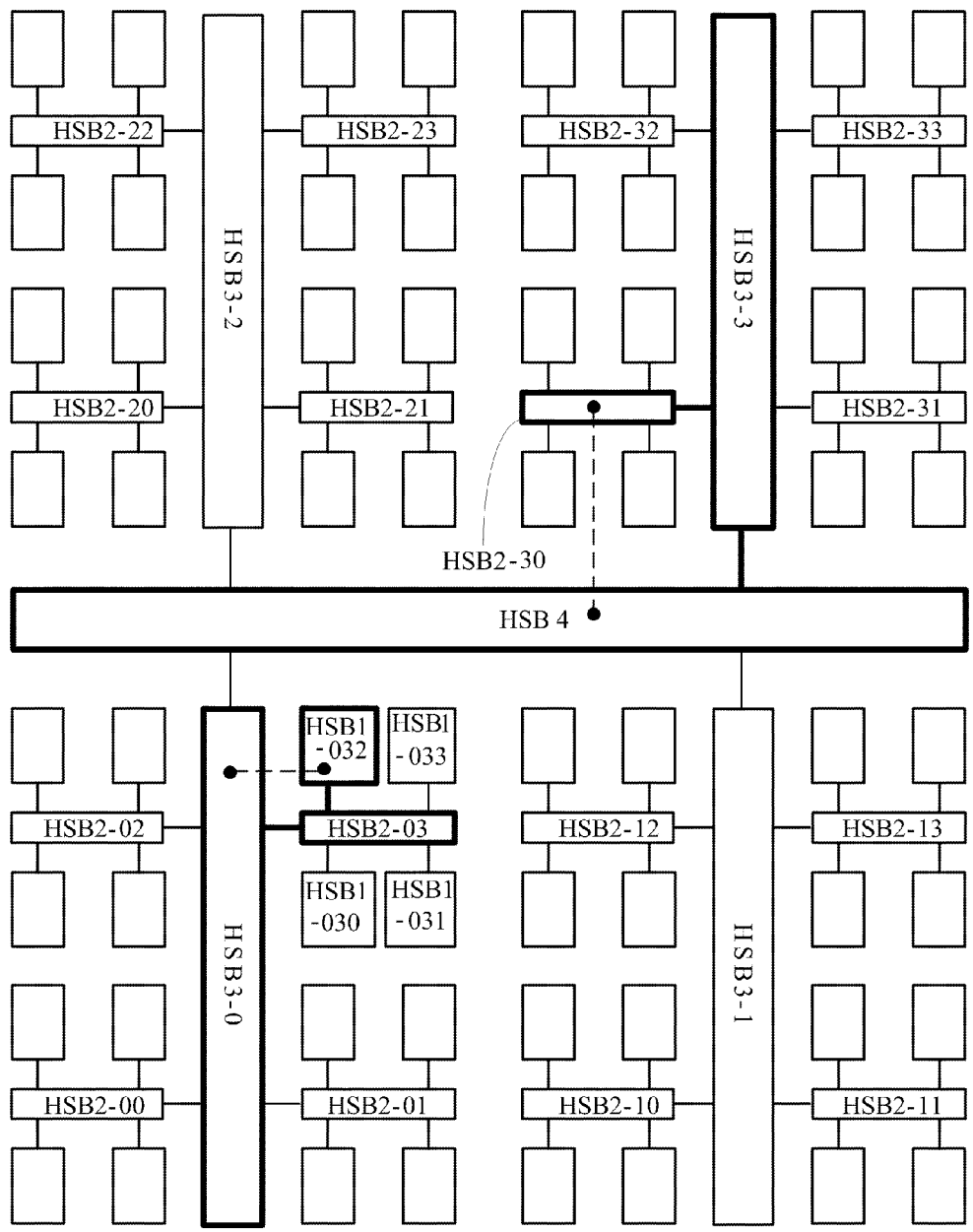
FIG. 7 is the layout diagram of the interconnect network of FIG. 6.

FIG. 7 is the layout diagram of the interconnect network of FIG. 6. From the FIG. 7, it can be noted that HSB3-0 and HSB1-032 are physically near, and HSB4 and HSB2-30 are physically near. By crosslink, they are interconnected directly with each other. Also, the tree paths and the HSBs in the paths are shown thickened.

Figure 8:
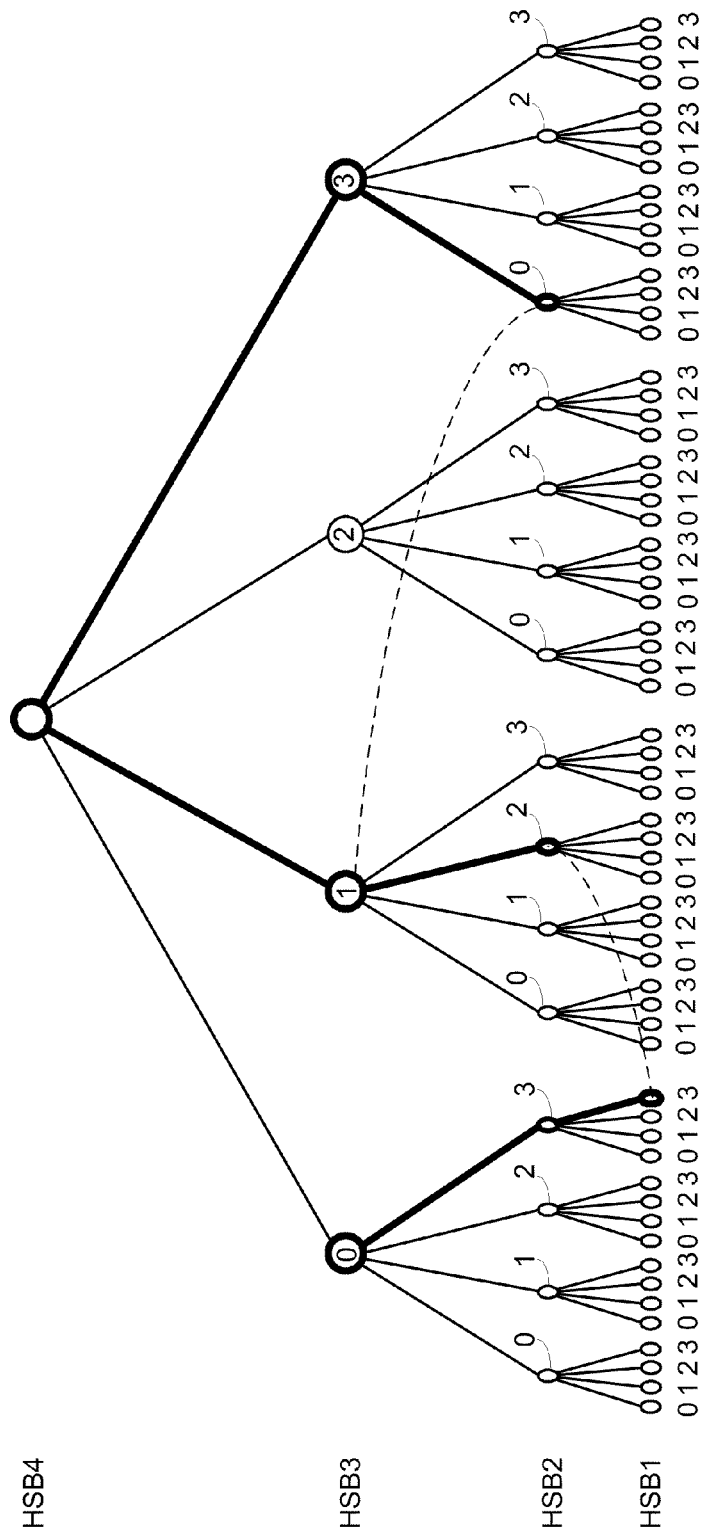
FIG. 8 is a logic graph illustrating crosslink established between HSBs belonging to the different subtree and of different levels.

FIG. 8 is a logic graph illustrating crosslink established between HSBs belonging to the different subtree and of different levels wherein one HSB is not an ancestor of the other. As shown in FIG. 8, a HSB3-1 is cross-linked with a HSB2-30, without HSB4 and HSB3-3 in the tree path being involved. Another two HSBs, HSB1-033 and HSB2-12 are cross-linked, and no more HSB (HSB2-03, HSB3-0, HSB4, HSB3-1 of the tree path) involved.

Figure 9:
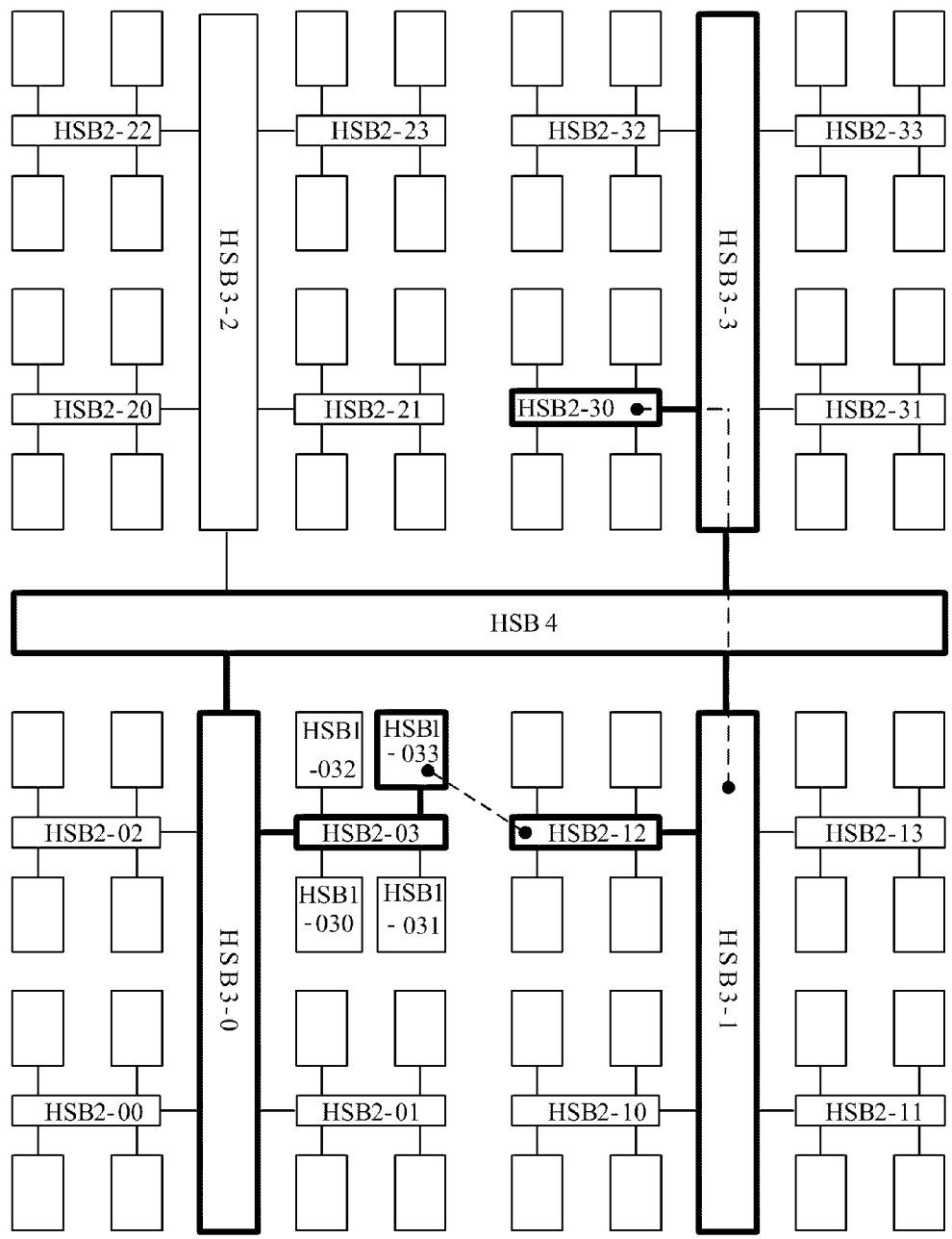
FIG. 9 is the layout diagram of the interconnect network of FIG. 8.

FIG. 9 is the layout diagram of the interconnect network of FIG. 8. From the FIG. 9, it can be noted that HSB1-033 and HSB2-12 are physically near, but HSB3-1 and HSB2-30 are not physically near. Instead, HSB3-1 are shown to be distant away from HSB2-30. It means that crosslink may be established between two HSBs logically far and physically far to improve timing.

In both FIG. 8 and FIG. 9, the traditional tree-structured interconnect paths and the HSBs in the paths are shown thickened.

Figure 10:
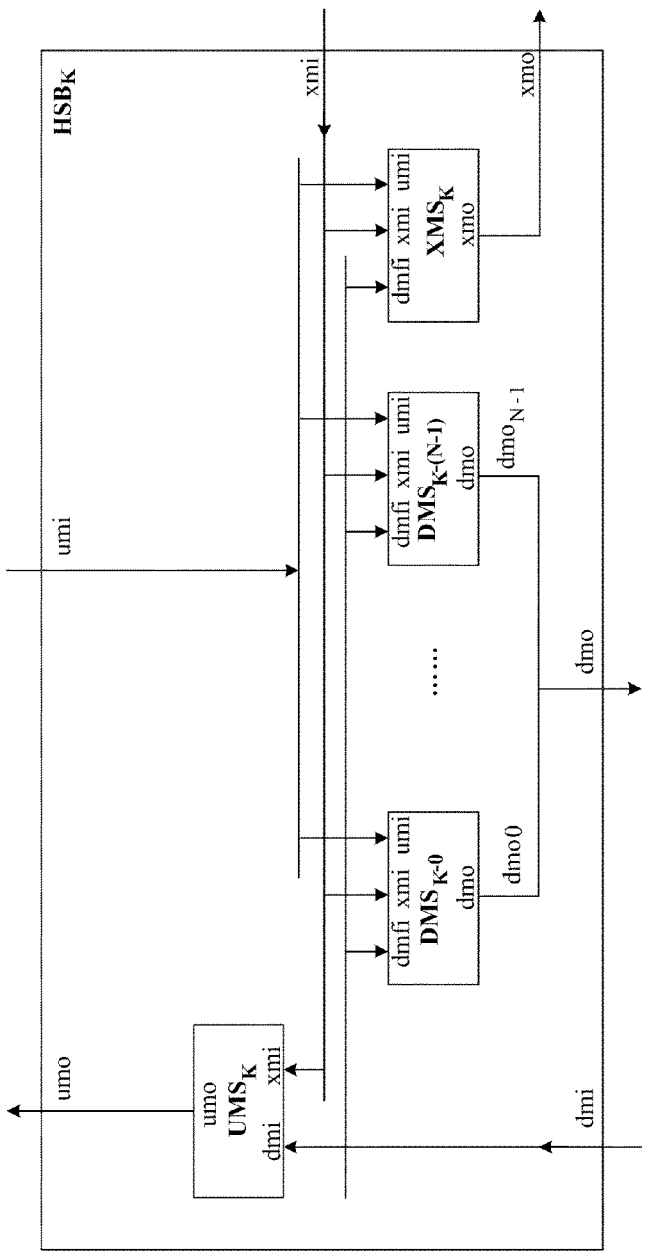
FIG. 10 illustrates a block diagram of an HSB used in the interconnect network.

FIG. 10 illustrates a block diagram of an HSB used in the interconnect network. The HSB is labeled as $HSB_k$, where k represents the hierarchical level of the HSB. HSBs in different levels have similar structure, and may differ from each other in the width of their interface (including umi, umo, dmi, dmo, xmi, xmo). Therefore, $HSB_k$ may represent any HSB in the previous figures or HSB of even higher level.

In FIG. 10, $HSB_k$ comprises a plurality of switch cells implemented by multiplexers (MUXs), i.e., upstream MUX switch $UMS_k$, downstream MUX switch $DMS_k$-0, ..., and $DMS_k$-(N-1), and external MUX switch XMS.

The HSBk has a plurality of inputs and outputs, i.e., downstream MUX inputs dmi, upstream MUX input umi, upstream MUX output umo and downstream MUX outputs dmo, external MUX input xmi and external MUX output xmo.

The input dmi may be connected to output of a logic cell connecting to the $HSB_k$ when k=1, or to output umo of any HSB of level k−1 connecting to the $HSB_k$ when k is an integer other than 1. The outputs dmo may be connected to input of a logic cell connecting to the $HSB_k$ when k=1, or to input umi of any HSB of level k−1 connecting to the $HSB_k$ when k is other than 1. The input umi may be connected to output dmo of the HSB of level k+1 connecting to the $HSB_k$. The output umo may be connected to input dmi of the HSB of level k+1 connecting to the $HSB_k$. Input xmi and output xmo may be connected respectively to output xmo and input xmi of another HSB in any level so as to establish crosslink there between.

The $UMS_k$ functions to receive input signals dmi and xmi and, under control of configuration bits, select either dmi or xmi to output at terminal umo.

The $DMS_k$-j, in which j=1, 2, 3, or 4, etc, has downstream MUX feedback inputs dmfi, upstream MUX input umi, external MUX input xmi and downstream MUX output dmo. Note that signal dmfi is from input dmi. The $DMS_k$-j is configured to receive input signals, including dmfi from input dmi, umo from input umi, and xmi from input xmi, and, under the control of configuration bits, selects the received signal as $dmo_j$ to be output. One of the $dmo_j$, in which j=1, 2, 3, or 4 etc, is selected to output via output terminal dmo.

The $XMS_k$ functions to receive input signal dmfi from input dmi, input signal xmi from input xmi and input signal umi from input umi. Then, XMSk selects, under control of configuration bits, one of the input signals as xmo and output it to terminal xmo. On the other hand, input signal from xmi is then sent to $DMS_k$-0, $DMS_k$-1, ..., and $DMS_k$-(N-1), and also $UMS_k$.

It should be noted that the switch boxes as mentioned above may be implemented by pass transistors, pass gates, multiplexers or other elements that can execute logical selection and connectivity functions. The multiplexers (MUXs) are preferred since they need less space to store configuration bits compared to other switch boxes.

In the previous embodiments, crosslink is used to establish direct interconnect between HSBs physically near but logically far or HSBs physically far and logically far. However, crosslink may also be helpful to HSBs physically near and logically near.

Figure 11:
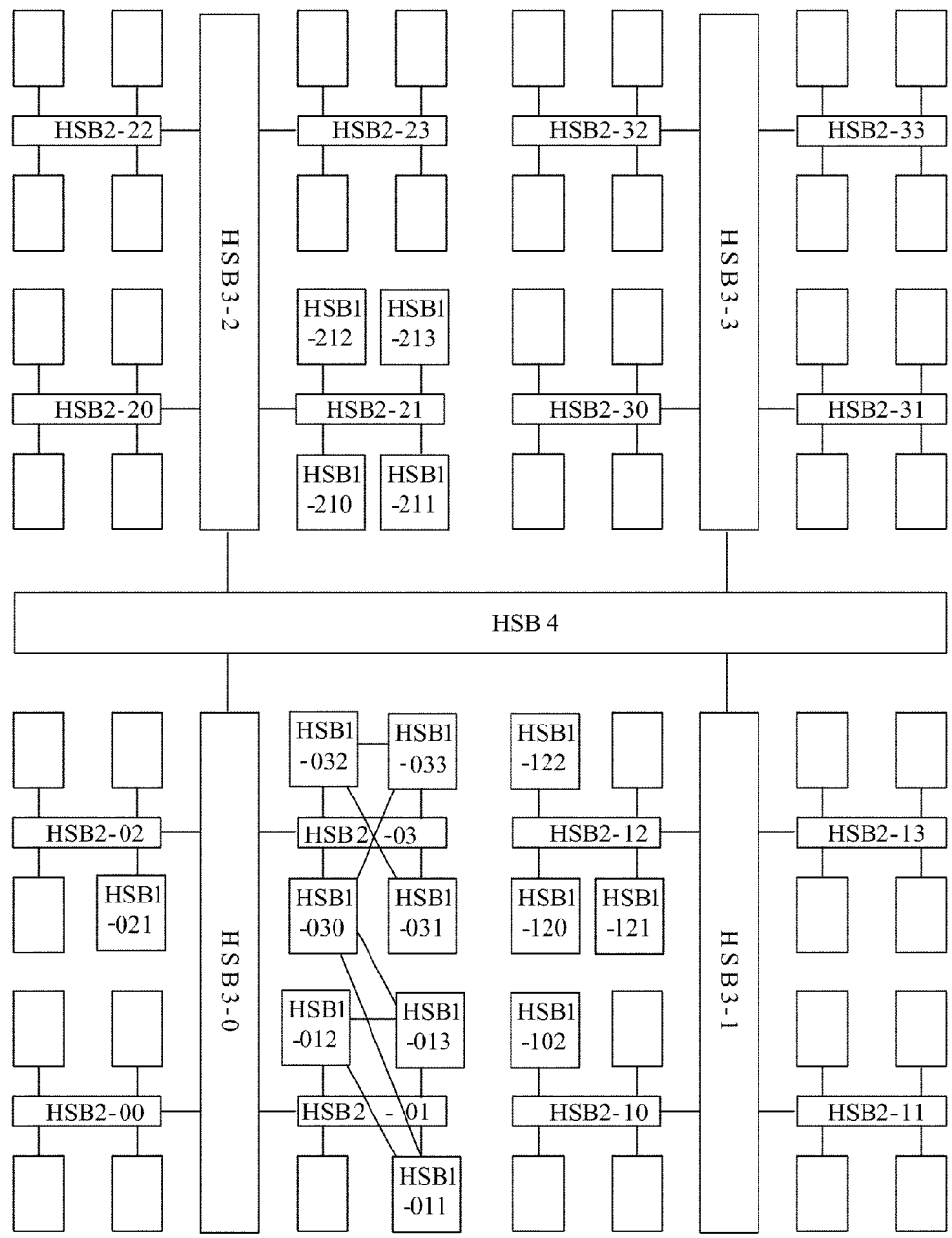
Figure 11:
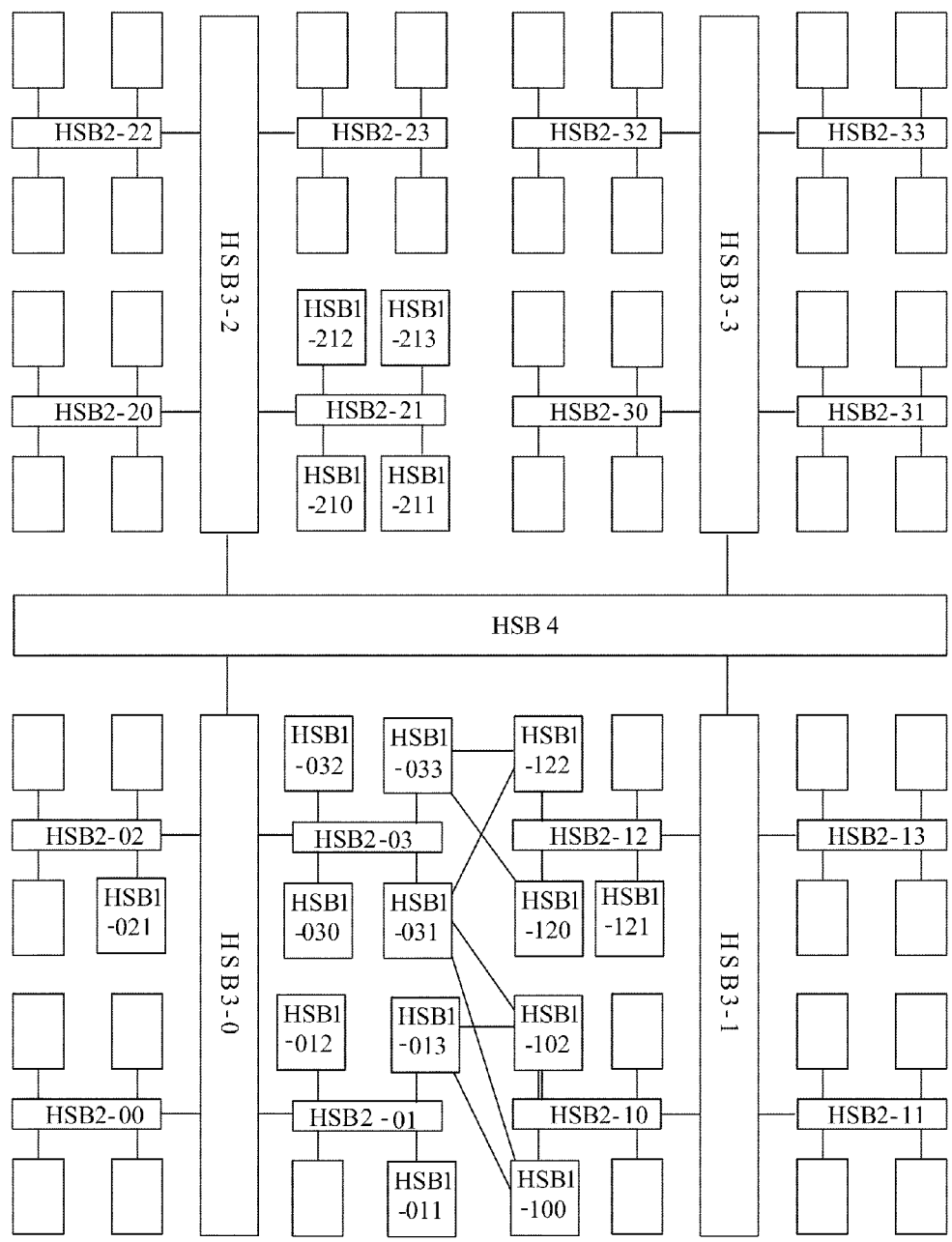

FIG. 11 illustrates how layout position may be limited by hierarchical interconnect. As shown by FIG. 11(a), logic layout of a certain application is formed by HSB1-030, HSB1-031, HSB1-032, HSB1-033, HSB1-011, HSB1-012, HSB1-013. The logic layout includes interconnections established in each pair of HSB1-032 and HSB1-033, HSB1-032 and HSB1-031, HSB1-030 and HSB1-033, HSB1-030 and HSB1-013, HSB1-030 and HSB1-011, HSB1-012 and HSB1-011. From the figure, it is noted that these HSBs share the same grandparent HSB, which means they are logically near and physically near. Each pair of HSBs could be interconnected by tree path. Therefore, it is not difficult to establish the interconnections as required with reasonable timing.

However, sometimes it is not easy to implement such a layout in FIG. 11(a). For some reasons, such as carry chain, the layout has to move, for example one column, to be the layout in FIG. 11(b).

In FIG. 11(b), HSB1-033 and HSB1-120, which are used to implement the same function as HSB1-032 and HSB1-031, are no long logically near, instead they are logically far. If tree path is still adopted, the timing will turn worse.

This prominently demonstrates position-sensitive feature of the tree-structured interconnect network.

FIG. 12(a) illustrates an enhanced stencil with crosslinks and FIG. 12(b) illustrates the stencil of FIG. 12(a) itself. The stencil is formed in the neighborhood of an HSB1-031 and crosslinks are established between HSB1-031 and its neighboring HSBs in level 1. As shown in FIG. 12(b), HSB1-031 could establish a crosslink having 16 wires with HSB1-030 and HSB1-120, respectively; establish a crosslink having 4 wires with HSB1-033 and HSB1-013, respectively; establish a crosslink having 4 wires with HSB1-021, HSB1-121, HSB1-211, and HSB1-011, respectively; establish a crosslink having 2 wires with HSB1-032, HSB1-012, HSB1-102 and HSB1-122, respectively. This kind of complicated crosslink in lower level increases local routability and decreases the influence of lateral placement sensitive feature of hierarchical architecture. If the stencil is moved laterally, for example one column, the stencil remains the same, and no interconnection needs to be changed.

It should be noted that crosslink established between HSBs of different levels may also reduce adverse influence of longitudinal or lateral layout sensitive feature of hierarchical architecture.

It has been shown that crosslinks in different directions may have different number of wires. Those skilled in the art could recognize that such a stencil may help place certain directional functions such as WLUT chain and carry chain.

Note that some of the neighboring HSB1 in the stencil, including HSB1-030, HSB1-032 and HSB1-033, are logically near and physically near the HSB1-031. They could establish tree path with HSB1-031 via HSB2-03. However, as mentioned in FIG. 11, local routability could be sacrificed if these crosslinks are replaced by tree-based interconnects.

The embodiments above show that crosslink could be used to improve interconnect timing and speed within a FPGA interconnect network. It will be highly appreciated that the concept of crosslink could be applied to inter-tree connection.

FIG. 13 is a logic graph illustrating interconnect network between a tree-based hierarchical interconnect network and an external functional block. As shown in FIG. 13, any HSB should first route within the tree structure to the HSB4 in the top level in order to be connected with the external functional block.

FIG. 14 illustrates a layout diagram of the tree path in FIG. 13. As shown in FIG. 14, the external functional block is an IO block (IOB) having IOC-0, IOC-1, IOC-2, IOC-3, and IOC-4 IO cells and an IO Switch Box (IOSB). By tree path, the IOC-0 cell needs to route through IOB, HSB4, HSB3-2 and HSB2-22 to reach HSB1-220, which is in a physically near relation with the IOC-0 cell.

FIG. 15 is logic graph illustrating a interconnect network comprising crosslink established between a tree-based hierarchical interconnect network and external functional blocks according to an embodiment of the present invention. In FIG. 15, a tree hierarchical architecture of interconnection network formed by HSBs, which may be as those in previous figures, is shown. To its right, there are shown external functional blocks, including a parent functional block and 5 children functional blocks. Each of HSB2-22, HSB1-220 and HSB1-222 has established a crosslink connection with the parent functional block. By crosslink, each of HSB2-22, HSB1-220 and HSB1-222 is directly connected to the external functional blocks, time delay being dramatically decreased.

FIG. 16 is the layout diagram of FIG. 15. In FIG. 16, the functional block is shown as an IO Block (IOB), which consists of one IO Switch Box (IOSB) and five IO cell (IOC) including IOC-0, IOC-1, IOC-2, IOC-3 and IOC-4. HSB2-22, HSB1-220 and HSB1-222 are physically near the IOB and the IOSB. Through IOSB, each of HSB2-22, HSB1-220 and HSB1-222 may be routed directly to any of IOC-0, IOC-1, IOC-2, IOC-3, and IOC-4.

It will be appreciated that the external functional blocks could be of tree architecture and/or each of the functional blocks therein could be Input Output block, Embedded Memory Block, FPGA block, or Mask Programmable (MP) Gate Array block.

In an example, crosslink(s) may be provided within the functional block in case that the functional block is of tree architecture.

Although the embodiments as shown above have been discussed with respect to FPGA circuit, the present invention may not be limited to FPGA circuit, but also applicable to any integrated circuit embedded with FPGA, such as CSoC and PSoC.

In addition, although the embodiments as shown above have been discussed with respect to FPGA circuit, the present invention may also apply to MPGA circuit or any integrated circuit embedded with MPGA.

FIG. 17 illustrates a hybrid integrated circuit according to another embodiment of the present invention. The circuit may be divided into two parts, the left and right parts. The left part is a tree-based hierarchical interconnect network of HSBs for FP array of logic cells, and the right part is a tree-based hierarchical interconnect network of HSBs for MP array of logic cells. Both of the HSB networks are surrounded by IO Blocks and surrounded by or embedded with External Memory Blocks.

Crosslinks may be established between an FP HSB and adjacent IOB/EMB, between an FP HSB and an adjacent MP HSB so as to improve local routablity and timing thereof.

Although the above interconnect network is shown to have a quad tree structure, it will be highly appreciated that the interconnect network can be of any tree structure.

Although in the embodiments as shown above, HSB is used to provide selection and connection to individual logic cells, it will be highly appreciated that HSB may also be used to provide selection and connection to a logic block formed by a plurality of logic cells.

While there has been described in connection with the preferred embodiments of the invention, it will be obvious to those skilled in the art that various changes and modifications may be made therein without departing from the invention.

It is aimed, therefore, to cover in the appended claims all such changes and modifications as fall within the true spirit and scope of the invention, which is defined by the metes and bounds of the appended claims.

What is claimed is:

1. An integrated circuit, comprising:
a programmable interconnect network; and
an array of logic blocks connected by said programmable interconnect network, said programmable interconnect network including a plurality of switch boxes organized in an upside-down tree-based multi-level hierarchical structure capable of providing selection and connection for said array of logic blocks, at least a portion of said plurality of switch boxes located at lowest level of said upside-down tree-based multi-level hierarchical structure being connected to said array of logic blocks;
wherein said programmable interconnect network includes a crosslink which provides a non-tree-structured shortcut between two of said plurality of switch boxes, wherein said two of said plurality of switch boxes are located at different levels of hierarchy of said upside-down tree-based multi-level hierarchical structure.

2. The integrated circuit as claimed in claim 1, wherein said two of the plurality switch boxes are logically far but physically near.

3. The integrated circuit as claimed in claim 2, wherein said two of the plurality switch boxes are logically near and physically near.

4. The integrated circuit as claimed in claim 1, wherein said two of the plurality switch boxes are logically far and physically far.

5. The integrated circuit as claimed in claim 1, wherein said two of the switch boxes are located in the same subtree of the tree, wherein one of said two switch boxes is the root of the subtree.

6. The integrated circuit as claimed in claim 2, wherein said two of the switch boxes are located in the same subtree of the tree, wherein one of said two switch boxes is the root of the subtree.

7. The integrated circuit as claimed in claim 3, wherein said two of the switch boxes are located in the same subtree of the tree, wherein one of said two switch boxes is the root of the subtree.

8. The integrated circuit as claimed in claim 4, wherein said two of the switch boxes are located in the same subtree of the tree, wherein one of said two switch boxes is the root of the subtree.

9. The integrated circuit as claimed in claim 1, wherein said two of the switch boxes are located in the same level of the tree.

10. The integrated circuit as claimed in claim 2, wherein said two of the switch boxes are located in the same level of the tree.

11. The integrated circuit as claimed in claim 3, wherein said two of the switch boxes are located in the same level of the tree.

12. The integrated circuit as claimed in claim 4, wherein said two of the switch boxes are located in the same level of the tree.

13. The integrated circuit as claimed in claim 1, wherein said two of the switch boxes are located in different subtree and different level of the tree.

14. The integrated circuit as claimed in claim 2, wherein said two of the switch boxes are located in different subtree and different level of the tree.

15. The integrated circuit as claimed in claim 3, wherein said two of the switch boxes are located in different subtree and different level of the tree.

16. The integrated circuit as claimed in claim 4, wherein said two of the switch boxes are located in different subtree and different level of the tree.

17. The integrated circuit as claimed in claim 1, wherein said array of logic cell is a Field Programmable Gate Array or Mask Programmable Gate Array.

18. The integrated circuit as claimed in claim 2, wherein said array of logic cell is a Field Programmable Gate Array or Mask Programmable Gate Array.

19. The integrated circuit as claimed in claim 3, wherein said array of logic cell is a Field Programmable Gate Array or Mask Programmable Gate Array.

20. The integrated circuit as claimed in claim 4, wherein said array of logic cell is a Field Programmable Gate Array or Mask Programmable Gate Array.

21. The integrated circuit as claimed in claim 1, wherein said plurality of switch boxes comprise multiplexers, pass transistors, or pass gates.

22. The integrated circuit as claimed in claim 1, wherein the logic block comprises one or more logic cells.

23. An integrated circuit, comprising:
a programmable interconnect network;
an array of logic blocks connected by said programmable interconnect network; and
a function block,
wherein said programmable interconnect network including a plurality of switch boxes arranged in a tree-based hierarchical architecture with a root at top and leafs at bottom of said tree-based hierarchical architecture capable of providing selection and connection for said array of logic blocks, said plurality of switch boxes located at lowest level of said tree-based hierarchical architecture are connected to said array of logic blocks,
wherein said integrated circuit includes a crosslink able to provide a non-tree-structured shortcut between one of said plurality of switch boxes and said function block, wherein said function block is situated external to said tree-based hierarchical architecture, wherein said one of said plurality of switch boxes and said function block are located at different levels of hierarchy of said tree-based hierarchical architecture.

24. The integrated circuit as claimed in claim 23, wherein said functional block is an IO block or a memory block.

25. The integrated circuit as claimed in claim 23, wherein said functional block is a Mask Programmable Gate Array or Field Programmable Gate Array connected by tree-based hierarchical architecture of switch boxes.

26. The integrated circuit as claimed in claim 25, wherein said function block comprises a crosslink established between two of said plurality switch boxes.

27. The integrated circuit as claimed in claim 23, wherein said programmable interconnect network comprises a crosslink established between two of said plurality of switch boxes.

28. The integrated circuit as claimed in claim 23, wherein said plurality of switch boxes comprise multiplexers, pass transistors, or pass gates.

29. The integrated circuit as claimed in claim 23, wherein the logic block comprises one or more logic cells.

\* \* \* \* \*